United States Patent
Volokhine (10) Patent No.: US 10,312,905 B2
(45) Date of Patent: *Jun. 4, 2019

(54) ADJUSTABLE LOSSES ON BOND WIRE ARRANGEMENT

(71) Applicant: NXP USA, Inc., Austin, TX (US)

(72) Inventor: Youri Volokhine, Stevensbeek (NL)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/985,642

(22) Filed: May 21, 2018

(65) Prior Publication Data

US 2018/0269873 A1    Sep. 20, 2018

Related U.S. Application Data

(62) Division of application No. 15/033,869, filed as application No. PCT/IB2013/002732 on Nov. 7, 2013, now Pat. No. 9,979,388.

(51) Int. Cl.
  *H03K 17/689* (2006.01)
  *H03K 17/16* (2006.01)
  (Continued)

(52) U.S. Cl.
  CPC .......... *H03K 17/689* (2013.01); *H01L 23/66* (2013.01); *H01L 24/09* (2013.01); *H01L 24/49* (2013.01); *H03F 3/193* (2013.01); *H03F 3/195* (2013.01); *H03F 3/213* (2013.01); *H01L 24/05* (2013.01); *H01L 24/45* (2013.01); *H01L 24/48* (2013.01); *H01L 2223/6611* (2013.01); *H01L 2223/6655* (2013.01); *H01L 2224/04042* (2013.01); *H01L 2224/05554* (2013.01); *H01L 2224/09505* (2013.01); *H01L 2224/45015* (2013.01); *H01L 2224/45124* (2013.01); *H01L 2224/48091* (2013.01); *H01L 2224/48137* (2013.01); *H01L 2224/48472* (2013.01);
  (Continued)

(58) Field of Classification Search
  CPC ....... H03K 17/689; H01L 24/09; H01L 24/49; H01L 2224/05554; H01L 2224/05599; H01L 2224/09505; H01L 2224/48091; H01L 2224/48472; H01L 2224/00014; H01L 2224/13091; H01L 2924/3011; H03F 3/193; H03F 3/213
  USPC ..... 327/108–112, 379, 389, 391; 326/22–27, 326/81–87
  See application file for complete search history.

(56) References Cited

U.S. PATENT DOCUMENTS

2005/0286278 A1* 12/2005 Perreault ................ H02J 1/102
                                                            363/65
2009/0174482 A1*  7/2009 Blednov ................ H01L 23/66
                                                            330/277

(Continued)

*Primary Examiner* — Brandon S Cole (57) ABSTRACT

The invention provides a bond wire arrangement comprising a signal bond wire (1) for operably connecting a first electronic device (6) to a second electronic device (8), and a control bond wire (2) being arranged alongside the signal bond wire at a distance so as to have a magnetic coupling with the signal bond wire (1), and having a first end (11) coupled to ground, and a second end (12) coupled to ground via a resistive element (14). The proposed solution allows the control of the Q factor (losses) of wire bond inductors during assembly phase, which will save time and reduce overall design cycle as compared to known methods.

23 Claims, 8 Drawing Sheets

(51) Int. Cl.
*H03K 17/687* (2006.01)
*H03K 3/00* (2006.01)
*H01L 29/49* (2006.01)
*G05F 1/00* (2006.01)
*H03K 17/691* (2006.01)
*G01J 5/34* (2006.01)
*H03F 3/213* (2006.01)
*H03F 3/193* (2006.01)
*H01L 23/00* (2006.01)
*H01L 23/66* (2006.01)
*H03F 3/195* (2006.01)

(52) U.S. Cl.
CPC ............ *H01L 2224/49052* (2013.01); *H01L 2224/49096* (2013.01); *H01L 2224/49175* (2013.01); *H01L 2224/85399* (2013.01); *H01L 2924/13091* (2013.01); *H01L 2924/207* (2013.01); *H01L 2924/3011* (2013.01); *H01L 2924/30107* (2013.01); *H01L 2924/30111* (2013.01); *H03F 2200/451* (2013.01); *H03F 2200/541* (2013.01)

(56) References Cited

U.S. PATENT DOCUMENTS

| | | | |
|---|---|---|---|
| 2009/0309235 A1* | 12/2009 | Suthiwongsunthorn | H01L 23/3114 257/777 |
| 2010/0090767 A1* | 4/2010 | Ohnishi | H03F 1/0272 330/277 |
| 2010/0164645 A1* | 7/2010 | Kobayashi | H03F 1/565 333/32 |
| 2011/0273236 A1* | 11/2011 | Heijden | H03F 1/0294 330/295 |
| 2013/0033325 A1* | 2/2013 | Ladhani | H03F 1/0288 330/277 |
| 2013/0194054 A1* | 8/2013 | Presti | H04B 1/0458 333/112 |
| 2015/0084718 A1* | 3/2015 | Maxim | H01F 17/0013 333/174 |
| 2015/0372645 A1* | 12/2015 | Banerjee | H03F 3/193 330/251 |
| 2016/0233849 A1* | 8/2016 | Marbell | H01L 23/66 |
| 2017/0194918 A1* | 7/2017 | Wallis | H03F 1/22 |

* cited by examiner

Fig. 11

ADJUSTABLE LOSSES ON BOND WIRE ARRANGEMENT

CROSS-REFERENCE TO RELATED APPLICATIONS

This application is a divisional of co-pending, U.S. patent application Ser. No. 15/033,869, filed on May 2, 2016, which is a 371 of international application PCT/IB2013/002732, filed on Nov. 7, 2013.

FIELD OF THE INVENTION

The present invention generally relates to microelectronic interconnects and, more particularly wire bonds in connection to high-power power amplifiers and power amplifier integrated circuits.

BACKGROUND OF THE INVENTION

Wire bond inductors are commonly used as a connection to package leads and as a part of matching networks for RF/MW (:Radio Frequency/Millimeter-Wave) high power amplifiers. A self-inductance of a wire bond (or array of wire bonds) is a function of height and shape of the wires, so by varying the height and/or shape during wire bonding, the self-inductance can be controlled. However, high quality factor Q of these wires is a function of used metal for example aluminium and in some cases extra losses are beneficial for overall performance of power amplifier.

In multistage power amplifiers and also in integrated circuits, there is essential trade-off between stability and gain. An optimum is often found by introducing variation into sensitive components such as inductors, during design phase or by trimming/design modifications, which may be expensive and time consuming. So there is still a need for improving the performance of electronic circuits by way of optimizing the Q factor of wire bonds which is more flexible.

SUMMARY OF THE INVENTION

The present invention provides a bond wire arrangement as described in the accompanying claims. The invention also provides a bypass network, a RF match network and power amplifier circuit comprising such a RF match network. It also provides an integrated circuit comprising such a bond wire arrangement. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
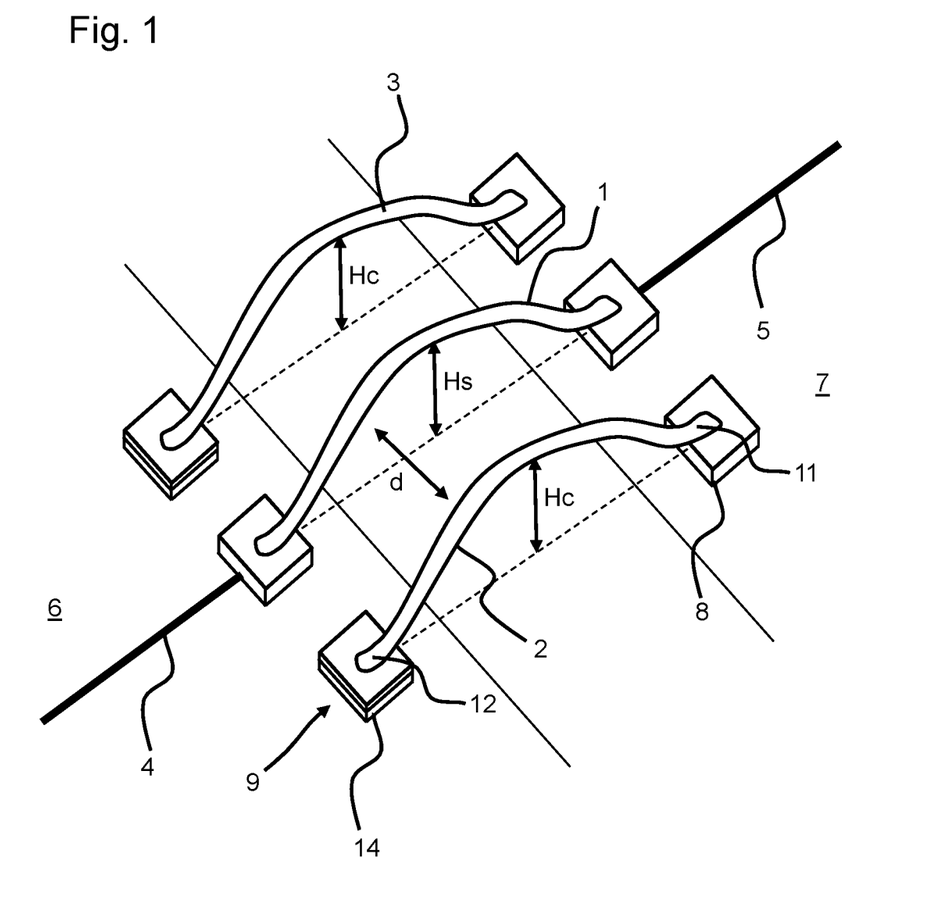
FIG. 1 is a perspective view of a signal bond wire and control bond wires with additional losses in the ground connection path according to an embodiment of the invention.

FIG. 1 is a perspective view of a signal bond wire 1 and two control bond wires 2, 3 according to an embodiment of the invention. The signal bond wire 1 and the control bond wires 2, 3 could be part of an electronic circuit, such as for example an RF integrated circuit, as will be explained below in more detail. The signal bond wire 1 is arranged to operably connect a first signal line 4 of an electronic device 6 to a signal line 5 of another electronic device 7. The ground bond wire 2 has a first end 11 and a second end 12. The control bond wires 2 are arranged alongside the signal bond wire at a distance d so as to have a magnetic coupling with the signal bond wire 1. It is noted that the second control bond wire 3 could be at different distance than the distance d between the signal bond wire and the first control bond wire 2.

The signal bond wire 1 and the control bond wires 2, 3 have heights Hs and Hc, respectively. However it is noted that the shapes and heights H1, H2 may differ for the two types of bond wires. A bonding pad 8 for connecting the first control bond wire 2 to the device 7 is made of a metal, while a bonding pad 9 for connecting the first control bond wire 2 to the device 6 comprises a metal layer and a semiconductor layer 14 having a certain resistance. So the first end 11 of the control bond wire 2 is coupled to ground while the second end 12 of the control bond wire 2 is coupled to ground via a resistive element 14. The same account for control bond wire 3.

Instead of comprising only one signal bond wire and two ground wires, the bond wire arrangement could comprise an array of signal bond wires and/or an array of ground wires. Each of the signal bond wires could be interlaced between two ground bond wires or in any other possible configuration where there is a magnetic coupling between a signal bond wire and a ground bond wire.

Instead of the semiconductor layer 14, any other suitable resistive element can be arranged in series with a control bond wire 2, such as a resistor. Such resistive elements create losses in addition to the already present parasitic losses of control bond wire.

Figure 2:
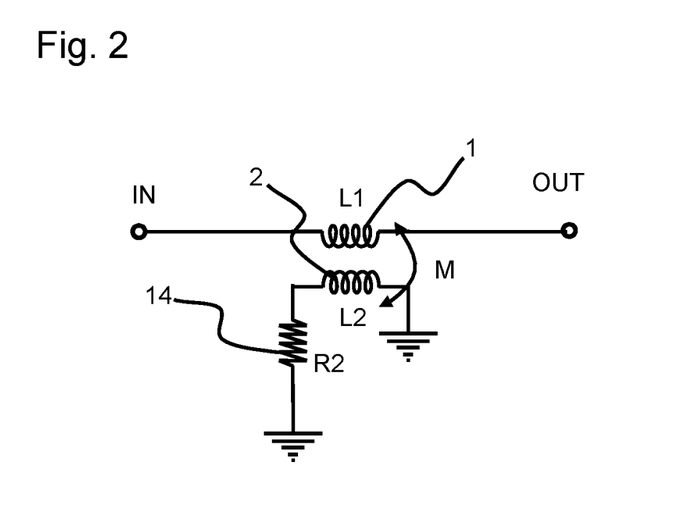
FIG. 2 schematically shows an electronic scheme of the embodiment of FIG. 1, where the control bond wire is coupled to the ground with extra losses in the ground path created by a resistance.

FIG. 2 schematically shows an electronic scheme of the embodiment of FIG. 1, where control wire bond 2 is coupled to the ground with extra losses in the ground path created by the resistive element 14 having a value $R_2$. As shown in FIG. 2, the signal bond wire has an inductance $L_1$ and the ground bond wire has an inductance of $L_2$.

The signal bond wire impedance Z1, when the terminal OUT is grounded, can be described as $Z_1=R_1+j\omega L_1$. The equivalent quality factor Qeq is the ratio $\omega L_1/R_1$. Resistive losses associated with $R_1$ are depending on the type of metal used and are usually small, whereas inductance $L_1$ at GHz frequency of operation creates several tens of times higher reactive impedance that resistive, therefore, Qeq is high, to reduce Qeq the control bond wire $Z_2=R_2+j\omega L_2$ is placed magnetically coupled to the signal bond wire with mutual inductance $M=k\sqrt{L_1 L_2}$, where k is coupling factor having value 0.1-0.7. Due to presence of a magnetically coupled control bond wire, the signal bond wire 1 futures modified equivalent impedance $$Z_\Sigma = R_1 + j\omega L_1 + \frac{\omega^2 M^2}{Z_2}$$

assuming ground termination of OUT. As a result the impedance of signal bond wire has additional term associated with control bond wire that is proportional to the frequency of operation and such term vanishes at DC frequency $\omega=0$. By changing coupling k it is possible to control Qeq with resistive part $R_2$ of the control bond wire atop of control of Leq of the signal bond wire during wire bonding process. By changing shapes and heights of coupled bond wires it is possible to maintain original $Z_\Sigma=L_1$ inductance that would have stand alone signal bond wire. Please note that such control of Qeq does not change the DC path of the signal bond wire, and therefore can be used to feed high current through the signal bond wire(s).

In an embodiment the resistive element 14 has a resistance value between 0.2-5Ω depending on power and frequency of operation. The distance d between the signal bond wire 1 and the ground bond wire(s) 2 may be less than 200 μm.

By choosing an appropriate height and shape for the signal bond wire 1 and the control bond wire(s) 2, 3 during the bonding process, it is possible to adjust coupling factor k and thus the amount of losses in the signal wire bond 1 whereas the absolute inductance L1 can be kept equal to the desired value.

Figure 3:
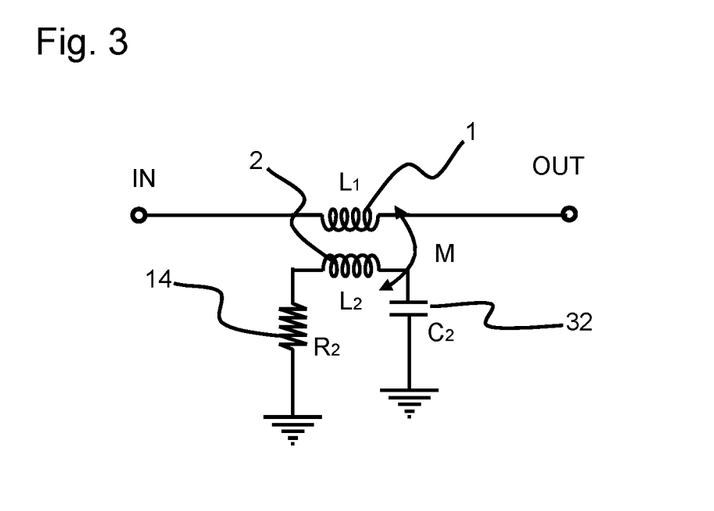
FIG. 3 shows a bond wire arrangement according to a further embodiment where the circuit comprises a capacitor arranged in series with the resistive element.

FIG. 3 shows a bond wire arrangement according to a further embodiment where the circuit comprises a capacitor 32 arranged in series with the resistive element 14. By introducing a series capacitor into the ground path with losses, frequency selective losses in the signal wire bond are possible close to the frequency $\omega=1/\sqrt{L_1 C_2}$. For example the value of $C_2$ can be selected in such a way to create resonance 200 MHz below the frequency of operation of the power amplifier for broad band input matching circuits.

Figure 4:
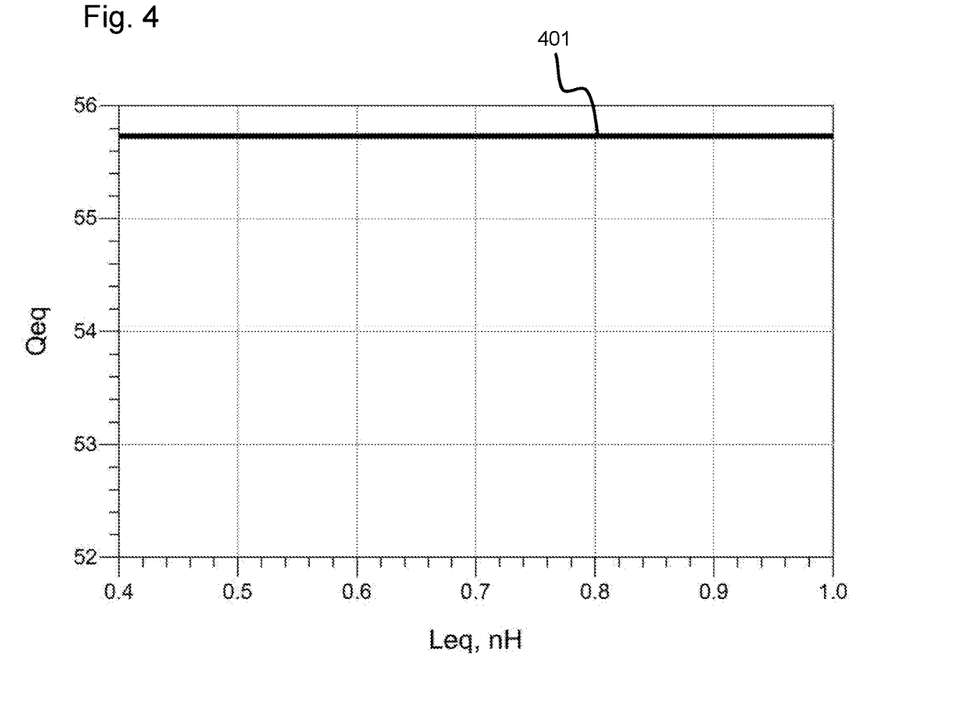
FIG. 4 shows a graph of the quality factor vs. equivalent inductance Leq for an array of signal bonds, without the added control bond wire(s)

FIG. 4 shows a graph of the equivalent quality factor Qeq as a function of the equivalent inductance Leq of a signal bond wire without any magnetically coupled control bond wire. It is noted that changing the height Hs of the signal bond wire will result in a change of the equivalent inductance Leq. From FIG. 4 it can be seen that changing the height Hs will not or nearly affect the equivalent quality factor Qeq, see line 104 which is (nearly) constant.

Figure 5:
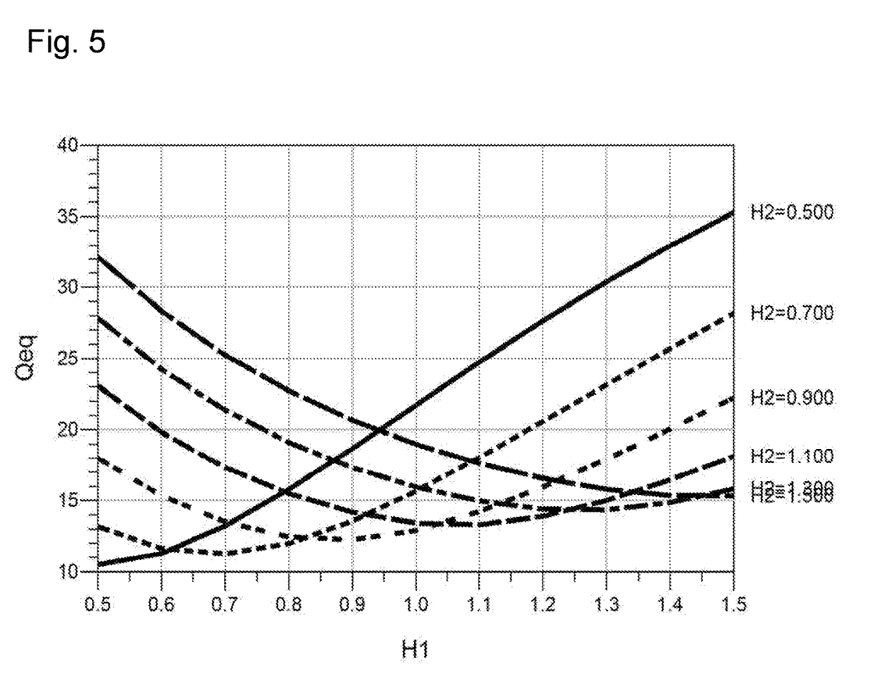
FIG. 5 shows a graph of the quality factor vs. change of height of signal bond wires H1 for an array of signal bond wire(s), with added control bond wire(s)

However when applying the arrangement according to the embodiment of FIG. 1, the Qeq can easily be changed by changing the height Hs, Hc of the bond wires 1,2,3, as will be shown in an example with reference to FIG. 5. FIG. 5 shows a graph of the quality factor Qeq vs. a change of height H1 of the signal bond wire 1 for an array of signal bond wire(s), with added control bond wire(s). In this simulation, the absolute height of each of the signal bond wires 1 is Hs=H0+H1, whereas the absolute height of each of the control bond wires 2, 3 is Hc=H0+H2. From FIG. 5 it can be seen that Qeq is depending on both H1 and H2. So by changing Hs and/or Hc, the Qeq can adequately be changed and determined during the bonding process.

Figure 6:
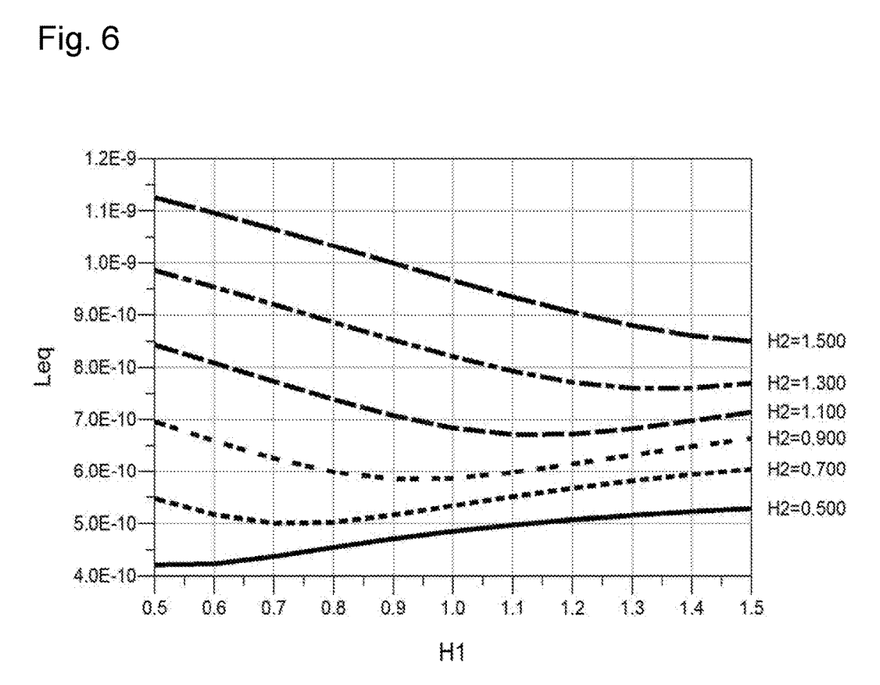
FIG. 6 shows a graph of the equivalent inductance Leq vs. change of height of signal bond wires H1 for an array of signal bond wire(s), with added control bond wire(s)

FIG. 6 shows a graph of the equivalent inductance Leq as a function of relative change of height of signal bond wire 1 for an array of signal bond wire(s), with the added control bond wire(s) 2, 3. From FIG. 6 is can be seen that by adjusting height of signal bond wire(s) and height of control bond wire(s) the equivalent inductance of signal bond wire can be controlled in wide range 0.4-1.2 nH. This enables additional design options for desired Leq and Qeq.

Figure 7:
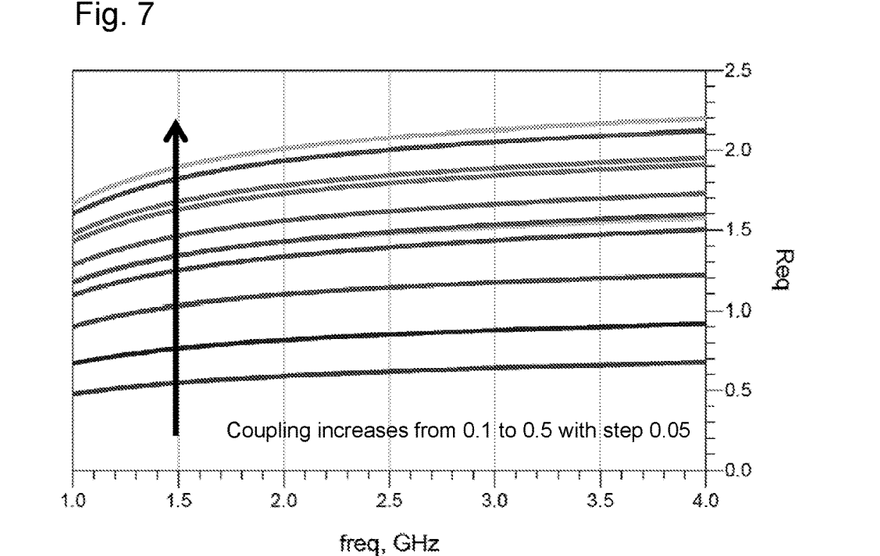
FIG. 7 shows a graph of an equivalent resistance $R_{eq}$ of the signal wire bond as a function of frequency for several heights H of the wires, where the grounded bond wire is in series with a 5 Ohm resistor.

FIG. 7 shows a graph of an equivalent resistance Req of the signal wire bond as a function of frequency for several heights (and thus several coupling factors) of the bond wires, where each control bond wires 2,3 is in series with a 5 Ohm resistor. From FIG. 7 it shows that equivalent resistance of signal bond wire can be controlled (i.e. modified) from 0.7 to 2.2 Ohm enabling the modification of Qeq from 10 to 35 during wire bonding process. The lines in FIG. 7 show Req for different coupling factors ranging from 0.1 to 0.5 with steps of 0.05.

Figure 8:
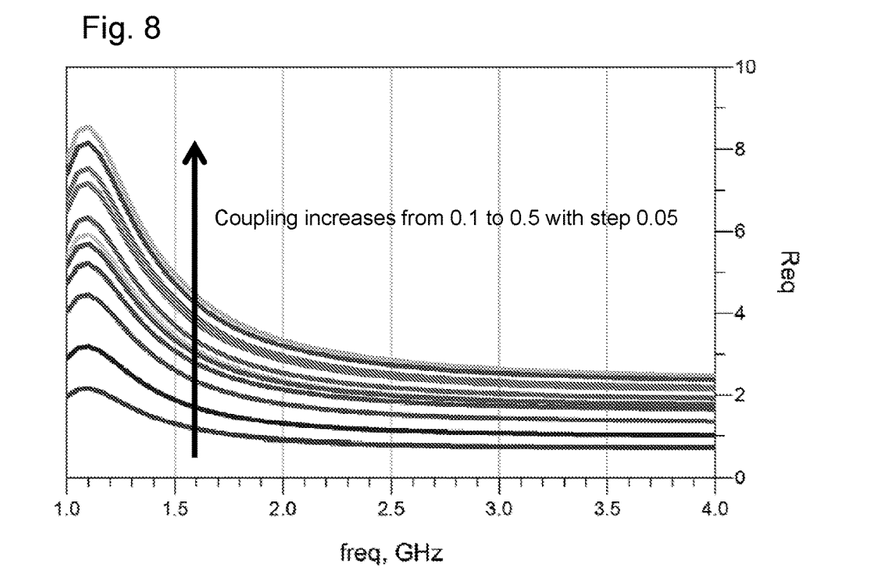
FIG. 8 shows another graph of the equivalent resistance $R_{eq}$ as a function of frequency for several heights h for frequency selective added losses.

FIG. 8 shows another graph of the equivalent resistance Req as a function of frequency for several heights coupling factors. The graph of FIG. 8 is made for the embodiment shown in FIG. 3 with the resistive element 14 having a value of 5Ω and the additional capacitor 32 having a value of 15 pF. By adding the capacitor 32, the Req is made frequency dependent. Such frequency dependent losses can be advantageous in broad band power amplifier circuits when the input matching network comprises a shunt inductance to compensate an input capacitance of e.g. a RF LDMOSFET (lateral diffusion MOSFET).

Figure 9:
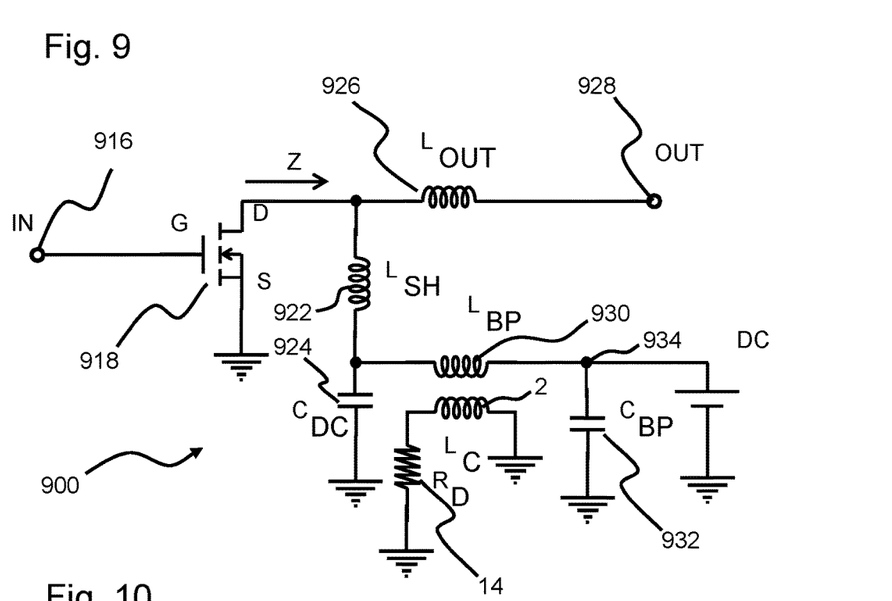
FIG. 9 shows a power amplifier circuit comprising a bypass output network according to an embodiment.

According to a further aspect, there is provided a bypass network for use in a RF match network of power amplifier circuit, the bypass network comprising a bond wire arrangement as described above. There is also provided a RF output match network for use in a power amplifier circuit, and a power amplifier circuit comprising such a RF match network. FIG. 9 shows an example of such a power amplifier circuit 900 according to an embodiment of the invention. The power amplifier circuit 900 includes an amplifier device 918, an output match network and a bypass network. The output match network comprises a shunt inductor 922 and a DC blocking capacitor 924. The RF output match network is coupled to an output of the power device 918. The RF output match network may be operable to provide a range of impedance matching over a signal bandwidth and a low frequency gain peak outside the signal bandwidth which corresponds to a low frequency resonance of the high quality factor RF path. The bypass network is coupled in parallel with the blocking capacitor of the RF output match network. The bypass network is operable to attenuate the low frequency gain peak while maintaining the high quality factor RF path. The bypass network comprises a bypass inductor 930 and a bypass capacitor 932 arranged in series with the bypass inductor 930. A DC power is coupled to a connection of the bypass capacitor and will function as feed of the power amplifier or as extra lead of the power amplifier circuit.

The power device 918 in this example is a RF LDMOS-FET (lateral diffusion MOSFET) but it is noted that it can be any other switching device as appreciated by the skilled person. The amplifier device 918 comprises a gate terminal G coupled to a signal input 916 of the power amplifier circuit 900. The amplifier device 918 also comprises a drain terminal D and a source terminal S. the source terminal S is coupled to ground and drain terminal D is coupled to the output lead.

As can be seen from FIG. 9, the bypass inductor 930, embodied by the signal bond wire 1, is magnetically coupled with the control bond wire 2 which is coupled to ground via the resistive element 14, also referred to as dumping resistor Rd. This will allow to reduce the effective inductance of the bypass inductor 930 (i.e. LBP) and to introduce losses at frequencies above DC while keeping the ability for the bypass inductor 930 to conduct a high DC feed current which is required for the operation of the power amplifier circuit.

Figure 10:
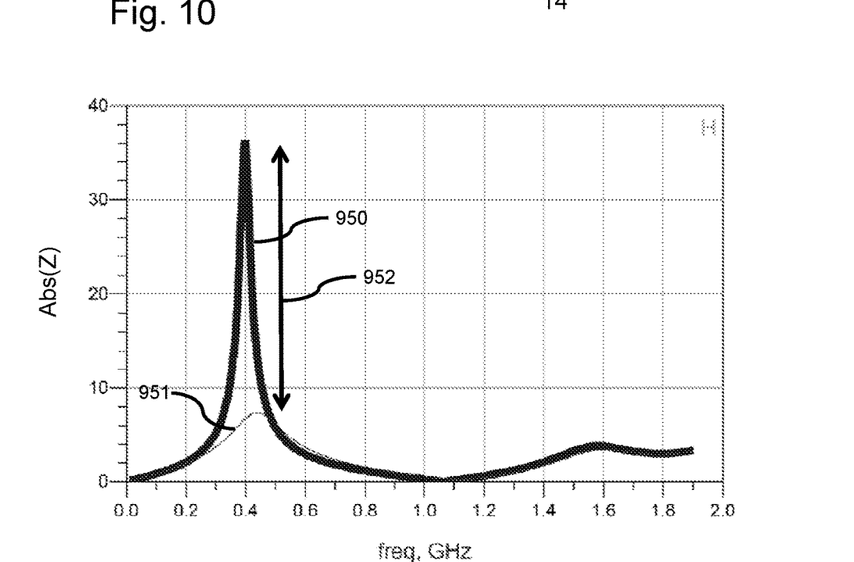
FIG. 10 shows a graph of simulation results of the an impedance seen by the switching device of the power amplifier circuit with and without coupled losses in the bypass network shown in FIG. 9.

FIG. 10 shows a graph of simulation results of an impedance Z seen by the RF LDMOS 918 with and without coupled losses (i.e. lossy control bond wire). In FIG. 10 a curve 950 represents the impedance as a function of frequency in case the output circuit shown in FIG. 9 does not have the coupled ground wire 2 and resistive element 14. In this case the impedance shows a very high peak at the frequency of about 0.4 GHz. Such impedance peak creates high risk of oscillation, can damage a power amplifier circuit and deteriorates linearity.

A curve 951 in FIG. 10 represents the impedance in case the ground wire 1 and resistive element 14 are present in circuit of FIG. 9. Curve 951 shows a peak, but this peak is a lot smaller than the peak of curve 950. Arrow 952 indicates the improvement due to the coupling of the bond wires as described above.

Figure 11:
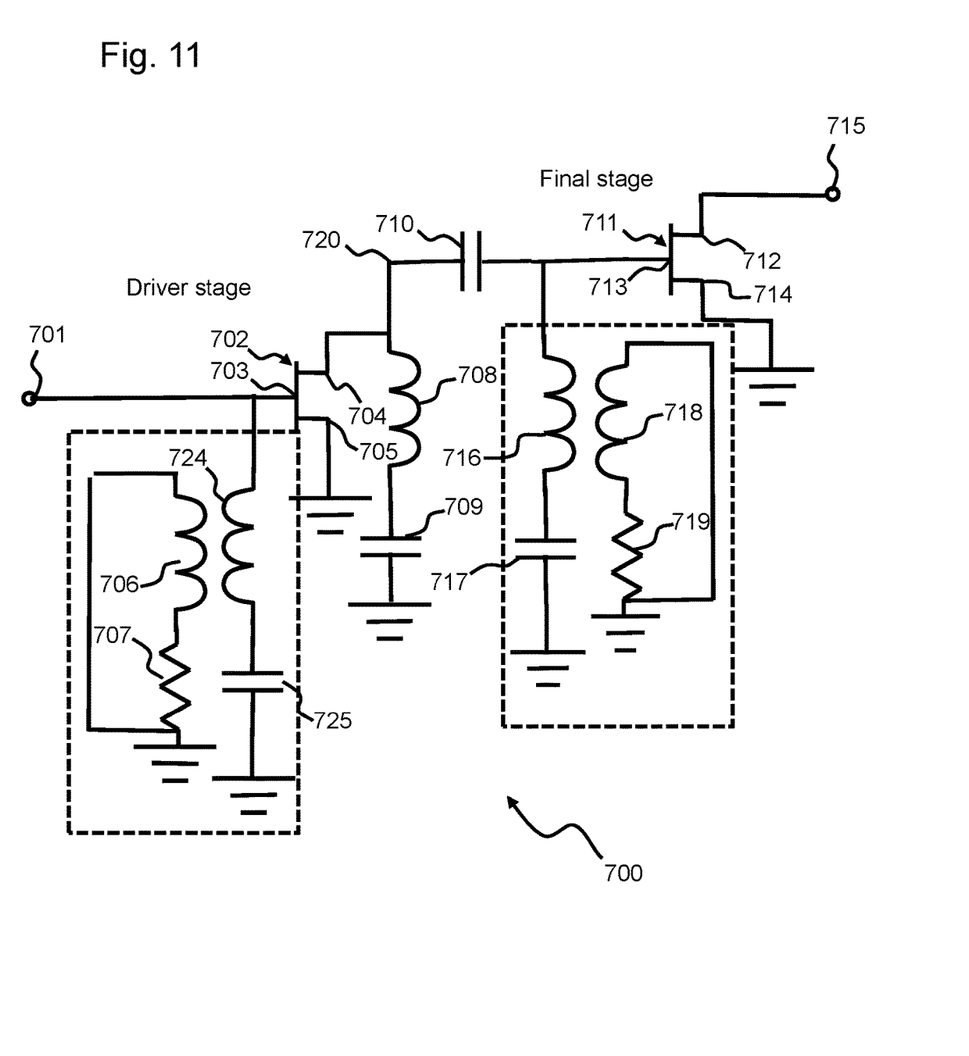
FIG. 11 schematically shows an example of an RF integrated circuit comprising a bond wire arrangement according to an embodiment.

According to an aspect, there is provided an RF integrated circuit comprising a bond wire arrangement as described above with reference to FIGS. 1-4, wherein the bond wire arrangement is arranged in a driver and/or an final stage of the RF integrated circuit. FIG. 11 schematically shows an example of such an RF integrated circuit. In the example a two-stage RFIC 700 is matched using one or more matching networks. The RF integrated circuit 700 comprises an input terminal 701 and a switching device 702 having a control terminal 703, a first output terminal 704 and a second output terminal 705. The control terminal 703 is coupled to the input terminal 701. The second output terminal 705 of the switching device 702 is coupled to ground. A first inductance 724 is arranged with a first and second connector, wherein the first connector is coupled to the input terminal 701. A first capacitance 725 is arranged with a first and second connector, with the first connector of the first capacitance 725 coupled to the second connector of the first inductance 724. The second connector of the first capacitance 725 is coupled to ground.

In the example of FIG. 11, the RF integrated circuit 700 also comprise an inductance 708 and a capacitance 709 coupled between the first output terminal 704 of the switching device 702 and ground.

In the example of FIG. 11, the RF integrated circuit also comprises a final stage. The final stage comprises an input terminal 720 and a switching device 711 having a control terminal 713, a first output terminal 712 and a second output terminal 715. The control terminal 713 is coupled to the input terminal 720. A first inductance 716 with a first and second connector, has its first connector coupled to the input terminal 720 via a capacitance 710. A first capacitance 717 with a first and second connector has its first connector coupled to the second connector of the first inductance 716, and its second connector coupled to ground.

In the RF integrated circuit 700 the inductance 724 and the inductance 716 are responsible for the band of operation. By introducing a bond wire 706 and a resistive element 707, see FIG. 11, desired losses are created in the inductance 724. Similarly, by introducing a bond wire 718 and a resistive element 719 in the final stage of the integrated circuit 700, desired losses are created in the inductance 716. By introducing excessive losses at the input of the final stage and/or driver stage it is possible to get stable operation without losing gain.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the circuits implementing the present invention is, for the most part, composed of electronic components known to those skilled in the art, circuit details will not be explained in any greater extent than that considered necessary as illustrated above, for the understanding and appreciation of the underlying concepts of the present invention and in order not to obfuscate or distract from the teachings of the present invention. Although the invention has been described with respect to specific conductivity types or polarity of potentials, skilled artisans appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably coupled," or "operably coupled," to each other to achieve the desired functionality.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency (RF) circuit comprising:
a switching device having a plurality of terminals, including a control terminal, a first output terminal, and a second output terminal;
a first inductance, the first inductance having a first connector and a second connector, wherein the first connector is coupled to one of the plurality of terminals of the switching device, and the first inductance is embodied as a first bond wire;
a first capacitance having a first connector and a second connector, wherein the first connector of the first capacitance is coupled to the second connector of the first inductance, and the second connector of the first capacitance is coupled to ground; and
a bypass network electrically coupled only to ground and not electrically coupled to the switching device, to the first inductance, or to other circuitry, wherein the bypass network includes
a second bond wire arranged alongside the first bond wire at a distance so as to have a magnetic coupling with the first bond wire, wherein the second bond wire is not electrically coupled to the first bond wire, wherein the second bond wire has a first end and a second end, and wherein the first end of the second bond wire is coupled to ground, and
a resistive element, wherein a second end of the second bond wire is coupled to ground through the resistive element.

2. The RF circuit of claim 1, wherein the first bond wire and the second bond wire have different shapes, the different shapes selected to result in a coupling factor between the first bond wire and the second bond wire that reduces a quality factor (Qeq).

3. The RF circuit of claim 2, wherein the different shapes comprise the first bond wire and the second bond wire having different heights.

4. The RF circuit of claim 1, wherein a coupling factor between the first and second bond wires is between 0.1-0.7.

5. The RF circuit of claim 1, wherein the distance between the first and second bond wires is less than 200 microns.

6. The RF circuit of claim 1, wherein the resistive element has a resistance between 0.2 Ohm and 5 Ohm.

7. The RF circuit of claim 1, wherein the resistive element comprises a resistor.

8. The RF circuit of claim 1, wherein the second bond wire is coupled to a metal bonding pad at the second end, and wherein the resistive element comprises a semiconductor layer formed under the metal bonding pad.

9. The RF circuit of claim 1, wherein the bypass network further comprises:
a second capacitance coupled in series with the resistive element.

10. The RF circuit of claim 9, wherein a value of the second capacitance creates a resonance below a frequency of operation of the RF circuit.

11. A radio frequency (RF) circuit comprising:
a switching device having a plurality of terminals, including a control terminal, a first output terminal, and a second output terminal;
a first inductance, the first inductance having a first connector and a second connector, wherein the first connector is coupled to one of the plurality of terminals of the switching device, and the first inductance is embodied as a first bond wire;
a first capacitance having a first connector and a second connector, wherein the first connector of the first capacitance is coupled to the second connector of the first inductance, and the second connector of the first capacitance is coupled to ground; and
a wire bond arrangement that includes
the first bond wire,
a second bond wire arranged alongside the first bond wire at a distance so as to have a magnetic coupling with the first bond wire, wherein the second bond wire has a first end and a second end, wherein the first end of the second bond wire is coupled to ground,
a resistive element, wherein a second end of the second bond wire is coupled to ground through the resistive element, and
a third bond wire arranged alongside the first bond wire at a second distance so as to have a second magnetic coupling with the first bond wire, wherein the third bond wire is arranged at a side of the first bond wire opposite from a side where the second bond wire is arranged.

12. The RF circuit of claim 1, wherein:
the first inductance is a shunt inductor coupled to the first output terminal of the switching device; and
the first capacitance is a DC blocking capacitor arranged in series with the shunt inductor so as to connect the first output terminal of the switching device to ground.

13. A radio frequency (RF) circuit comprising:
a switching device having a control terminal, a first output terminal, and a second output terminal;
a first inductance, the first inductance having a first connector and a second connector, wherein the first connector is coupled to the control terminal of the switching device, the second connector is coupled to ground, and the first inductance is embodied as a first bond wire; and
a wire bond arrangement that includes
the first bond wire,
a second bond wire arranged alongside the first bond wire at a distance so as to have a magnetic coupling with the first bond wire, wherein the second bond wire has a first end and a second end, wherein the first end of the second bond wire is coupled to ground, and
a resistive element, wherein a second end of the second bond wire is coupled to ground through the resistive element.

14. The RF circuit of claim 13, further comprising:
a first capacitance having a first connector and a second connector, wherein the first connector of the first capacitance is coupled to the second connector of the first inductance, and the second connector of the first capacitance is coupled to ground.

15. The RF circuit of claim 13, wherein the first bond wire and the second bond wire have different shapes, the different shapes selected to result in a coupling factor between the first bond wire and the second bond wire that reduces a quality factor (Qeq), and wherein the coupling factor between the first and second bond wires is between 0.1-0.7.

16. The RF circuit of claim 13, wherein the distance between the first and second bond wires is less than 200 microns.

17. The RF circuit of claim 13, wherein the wire bond arrangement further comprises:
a capacitance coupled in series with the resistive element.

18. A radio frequency (RF) circuit comprising:
a switching device having a control terminal, a first output terminal, and a second output terminal;
a first inductance, the first inductance having a first connector and a second connector, wherein the first connector is coupled to the first output terminal of the switching device, the second connector is coupled to ground, and the first inductance is embodied as a first bond wire; and
a bypass network electrically coupled only to ground and not electrically coupled to the switching device, to the first inductance, or to other circuitry, wherein the bypass network includes
a second bond wire arranged alongside the first bond wire at a distance so as to have a magnetic coupling with the first bond wire, wherein the second bond wire is not electrically coupled to the first bond wire, wherein the second bond wire has a first end and a second end, and wherein the first end of the second bond wire is coupled to ground, and
a resistive element, wherein a second end of the second bond wire is coupled to ground through the resistive element.

19. The RF circuit of claim 18, further comprising:
a first capacitance having a first connector and a second connector, wherein the first connector of the first capacitance is coupled to the second connector of the first inductance, and the second connector of the first capacitance is coupled to ground.

20. The RF circuit of claim 18, wherein the first bond wire and the second bond wire have different shapes, the different shapes selected to result in a coupling factor between the first bond wire and the second bond wire that reduces a quality factor (Qeq), and wherein the coupling factor between the first and second bond wires is between 0.1-0.7.

21. The RF circuit of claim 18, wherein the distance between the first and second bond wires is less than 200 microns.

22. The RF circuit of claim 18, wherein the bypass network further comprises:
a capacitance coupled in series with the resistive element.

23. The RF circuit of claim 18, wherein:
the first inductance is a shunt inductor coupled to the first output terminal of the switching device; and
the RF circuit further comprises a DC blocking capacitor coupled in series with the shunt inductor so as to connect the first output terminal of the switching device to ground.

* * * * *